United States Patent [19]

Mizomoto et al.

[11] Patent Number: 5,379,040
[45] Date of Patent: Jan. 3, 1995

[54] DIGITAL-TO-ANALOG CONVERTER

[75] Inventors: Hiroyuki Mizomoto; Yoshiaki Kitamura, both of Tokyo, Japan

[73] Assignee: NEC Corporation, Japan

[21] Appl. No.: 18,756

[22] Filed: Feb. 17, 1993

[30] Foreign Application Priority Data

Feb. 17, 1992 [JP] Japan .................. 4-029541

[51] Int. Cl.6 ............................................. H03M 3/00
[52] U.S. Cl. ..................................... 341/143; 341/136; 341/144
[58] Field of Search ................ 341/136, 143, 144, 150

[56] References Cited

U.S. PATENT DOCUMENTS

| | | | |
|---|---|---|---|
| 4,622,536 | 11/1986 | Shih et al. | 341/136 |
| 4,633,425 | 12/1986 | Senderowicz | 341/143 |
| 4,896,156 | 1/1990 | Garverick | 341/143 |
| 5,072,219 | 12/1991 | Boutaud et al. | 341/150 |
| 5,287,107 | 2/1994 | Gampell et al. | 341/143 |

OTHER PUBLICATIONS

Nikkei Electronics, Aug. 1988, No. 453, p. 220.
Technical Report, The Institute of Electronics, Information and Communication Engineers, ICD91-88, Aug. 1988.
A 16b Oversampling CODEC with Filtering DSP, by Toshiyuki Okamoto et al., 1991 IEEE International Solid-State Circuits Conference.

*Primary Examiner*—Howard L. Williams
*Attorney, Agent, or Firm*—Ostrolenk, Faber, Gerb & Soffen

[57] ABSTRACT

A digital-to-analog converter includes a decoder, a full differential type low-pass filter, and first to fourth switches. The decoder has first and second inputs and first and second outputs. The low-pass filter has first and second inputs and first and second outputs. The first switch has a first terminal connected to a first reference voltage source, a second terminal connected to the first input of the low-pass filter, and a third terminal as a control terminal connected to the first output of the decoder. The second switch has a first terminal connected to the first reference voltage source, a second terminal connected to the second input of the low-pass filter, and a third terminal as a control terminal connected to the second output of the decoder. The third switch has a first terminal connected to a second reference voltage source, a second terminal connected to the second input of the low-pass filter, and a third terminal as a control terminal connected to the first output of the decoder. The fourth switch has a first terminal connected to the second reference voltage source, a second terminal connected to the first input of the low-pass filter, and a third terminal connected to the second output of the decoder.

4 Claims, 8 Drawing Sheets

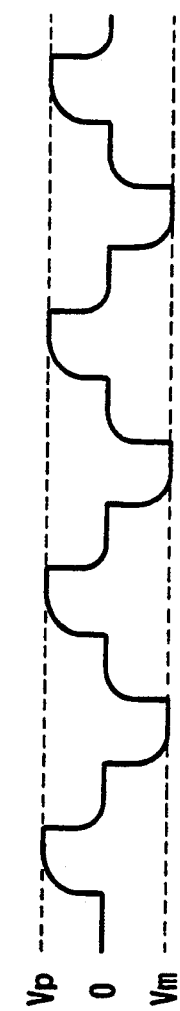

FIG.9A PRIOR ART — INPUT TO INPUT TERMINAL 19 (OUTPUT 37 FROM ΔΣ MODULATOR)

FIG.9B PRIOR ART — INPUT TO INPUT TERMINAL 20 (OVERSAMPLE CLOCK SIGNAL 34)

FIG.9C PRIOR ART — OUTPUT φ1 FROM DECODER 18

FIG.9D PRIOR ART — OUTPUT φ2 FROM DECODER 18

FIG.9E PRIOR ART — OUTPUT φ3 FROM DECODER 18

FIG.9F PRIOR ART — OUTPUT φ4 FROM DECODER 18

FIG.9G PRIOR ART — DIFFERENTIAL VOLTAGE 113 BETWEEN INVERTING OUTPUT 111 AND NONINVERTING OUTPUT 112
DIGITAL-TO-ANALOG CONVERTER

BACKGROUND OF THE INVENTION

The present invention relates to a device (to be referred to as a D/A converter hereinafter) for converting a digital signal into an analog signal and, more particularly, to a local D/A converter applied to an oversampling type D/A converter.

In some D/A converters, an original digital signal is interpolated in an input digital signal at the timing of a clock having a transfer rate 10 or more times higher than that of the input digital signal, and the interpolated signal undergoes digital filtering. Thereafter, a 1-bit digital signal obtained by pulse-density modulation of the original signal is output from a ΔΣ (delta/sigma) modulator. A D/A converter using such a scheme is called an oversampling type D/A converter (refer to, e.g., NIKKEI ELECTRONICS, August 1988, No. 453, p. 220, and Technical Report, The Institute of Electronics, Information and Communication Engineers, ICD91-88, August 1988).

According to this scheme, since the proportion of an analog circuit to the overall device is low, and a weighting scheme using capacitors and resistors is not used, a high-precision D/A converter can be realized.

FIG. 6 shows an oversampling type D/A converter. A digital signal 31 is input to an interpolation filter 61 at the timing of a clock signal 32. Digital data is then interpolated in the digital signal 31 at the period of an oversample clock signal 34. The signal is then filtered by a digital low-pass filter 62. The resultant signal is then input to a secondary ΔΣ modulator 71. The ΔΣ modulator 71 is constituted by two digital integrators 64 and 66, digital subtracters 63 and 65, and a quantizer 67. If an input to the ΔΣ modulator 71 is represented by X; an output from the ΔΣ modulator 71, by Y; and quantization noise, by Q, the following equation (1) is established:

$$Y = X + (1+Z^{-1})^2 \cdot Q \tag{1}$$

A 1-bit digital signal 37 obtained by pulse-density modulation of the digital signal 31, i.e., an output from the quantizer 67 which is an output from the ΔΣ modulator 71, is input to a local D/A converter 72 in synchronism with the oversample clock signal 34. The local D/A converter 72 is constituted by a 1-bit D/A converter 68 and a low-pass filter 69. When the output from the quantizer 67 is converted into an analog signal by the 1-bit D/A converter 68, and the analog signal is filtered by the low-pass filter 69, a high-precision analog signal 33 can be obtained.

FIGS. 7A to 7F show operations of the respective portions of the circuit shown in FIG. 6. As shown in FIG. 7C, data is inserted in the digital signal 31 in FIG. 7A, at a period $f_{\phi S}$ of the oversample clock signal 34 in FIG. 7F, by the interpolation filter 61, which receives the clock signal 32 shown in FIG. 7B, thereby obtaining an output 35. FIG. 7C exemplifies the case wherein zero data is inserted. In addition, an output 36 shown in FIG. 7D is obtained according to the characteristics of the digital low-pass filter 62. As indicated by equation (1), the input signal X (output 37) is directly obtained, as the output signal Y in shown in FIG. 7E, by the secondary ΔΣ modulator 71, except for quantization noise which is concentrated in a high-frequency range. That is, the data of the output 36 is equivalent to that of the output 35. In other words, the data of the output 37 is obtained by pulse-density modulation of the data of the output 36.

The example of an oversampling type D/A converter has been described above. Since the precision of a D/A converter of this scheme is greatly dependent on the precision of a local D/A converter, the local D/A converter has a full differential arrangement.

FIG. 8 shows a conventional example of the local D/A converter 72 in FIG. 6. Referring to FIG. 8, the local D/A converter has the following circuit arrangement. A switch S1 is arranged between the first electrode of a capacitor 13 and a reference voltage source 7; a switch S2, between the first electrode of the capacitor 13 and a reference voltage source 8; and a switch S4, between the first electrode of the capacitor 13 and a reference voltage source 9. A switch S1 is arranged between the first electrode of a capacitor 14 and the reference voltage source 8; a switch S2, between the first electrode of the capacitor 14 and the reference voltage source 7; and a switch S4, between the first electrode of the capacitor 14 and the reference voltage source 9. A switch S3 is arranged between the second electrode of the capacitor 13 and the reference voltage source 9; and a switch S4, between the second electrode of the capacitor 13 and the inverting input of a full differential type operational amplifier 17. A switch S3 is arranged between the second electrode of the capacitor 14 and the reference voltage source 9; and a switch S4, between the second electrode of the capacitor 14 and the noninverting input of the full differential type operational amplifier 17. The inverting input and noninverting output of the full differential type operational amplifier 17 are connected to each other through a capacitor 15, while a switch S3 is arranged between the inverting input and the noninverting input. The noninverting input and inverting output of the full differential type operational amplifier 17 are connected to each other through a capacitor 16, while a switch S3 is arranged between the noninverting input and the inverting output. The noninverting and inverting outputs of the full differential type operational amplifier 17 are respectively connected to the first and second inputs of a full differential type low-pass filter 10. The first and second outputs of the full differential type low-pass filter 10 are respectively connected to analog signal output terminals 11 and 12. The reference voltage sources 7, 8, and 9 are respectively set at voltages Vr−, Vr+, and Vag. The output 37 from the ΔΣ modulator 71 is input to an input terminal 19, i.e., the first input of a decoder 18. The oversample clock signal 34 is input to an input terminal 20, i.e., the second input of the decoder 18. Outputs Φ1, Φ2, Φ3, and Φ4 from the decoder 18 serve to control the switches S1, the switches S2, the switches S3, and the switches S4, respectively.

FIGS. 9A to 9G show operations of the respective portions of the circuit in FIG. 8. When a pulse-density-modulated output 37 (FIG. 9A) from the ΔΣ modulator 71 is input to the input terminal 19 of the decoder 18 constituting the local D/A converter 72, and an oversample clock signal 34 shown in FIG. 9B is input to the input terminal 20 of the decoder 18, the outputs Φ1, Φ2, Φ3, and Φ4 are decoded at the respective timings shown in FIGS. 9C to 9F, thus ON/OFF-controlling the switches S1, S2, S3, and S4, respectively. With this operation, as shown in FIG. 9G, a differential voltage 113 is generated between a noninverting output 111 and an inverting output 112 of the full differential type operational amplifier 17. If, for example, the difference voltage 113 (Vr+ −Vr−) is represented by Vp; and a difference voltage (Vr− −Vr+), by Vm, the difference voltage Vp is obtained when the output 37, as a digital signal, from the ΔΣ modulator 71 is at logic "1", whereas the difference voltage Vm is obtained when the output 37 is at logic "0". That is, digital signals of logic "1" and logic "0" are converted into analog signals Vp and Vm. These analog signals are then filtered by the full differential type low-pass filter 10. The resultant signals are obtained, as full differential analog signals of higher precision, from the analog signal output terminals 11 and 12.

In this conventional local D/A converter, since a digital signal is converted into an analog signal by using a full differential type operational amplifier, the speed of local D/A conversion is limited by the infinite GB product of the operational amplifier. More specifically, the limit frequency of D/A conversion based on the infinite GB product of the full differential type operational amplifier is generally set to be several tens of MHz. In addition, in order to increase the speed of D/A conversion, the GB product of the full differential type operational amplifier must be increased. As a result, the power consumption and the circuit size are increased.

SUMMARY OF THE INVENTION

It is an object of the present invention to provide a digital-to-analog converter which can achieve a high-speed operation.

It is another object of the present invention to provide a digital-to-analog converter which can achieve a reduction in power consumption and circuit size.

In order to achieve the above objects, according to the present invention, there is provided a digital-to-analog converter including a decoder having first and second inputs and first and second outputs, a full differential type low-pass filter having first and second inputs and first and second outputs, a first switch having a first terminal connected to a first reference voltage source, a second terminal connected to the first input of the full differential type low-pass filter, and a third terminal as a control terminal connected to the first output of the decoder, a second switch having a first terminal connected to the first reference voltage source, a second terminal connected to the second input of the full differential type low-pass filter, and a third terminal as a control terminal connected to the second output of the decoder, a third switch having a first terminal connected to a second reference voltage source, a second terminal connected to the second input of the full differential type low-pass filter, and a third terminal as a control terminal connected to the first output of the decoder, and a fourth switch having a first terminal connected to the second reference voltage source, a second terminal connected to the first input of the full differential type low-pass filter, and a third terminal connected to the second output of the decoder.

BRIEF DESCRIPTION OF THE DRAWINGS

FIGS. 9A to 9G are timing charts showing the waveforms of signals at the respective portions of the circuit in FIG. 8.

DESCRIPTION OF THE PREFERRED EMBODIMENT

An embodiment of the present invention will be described below with reference to the accompanying drawings.

Figure 1:
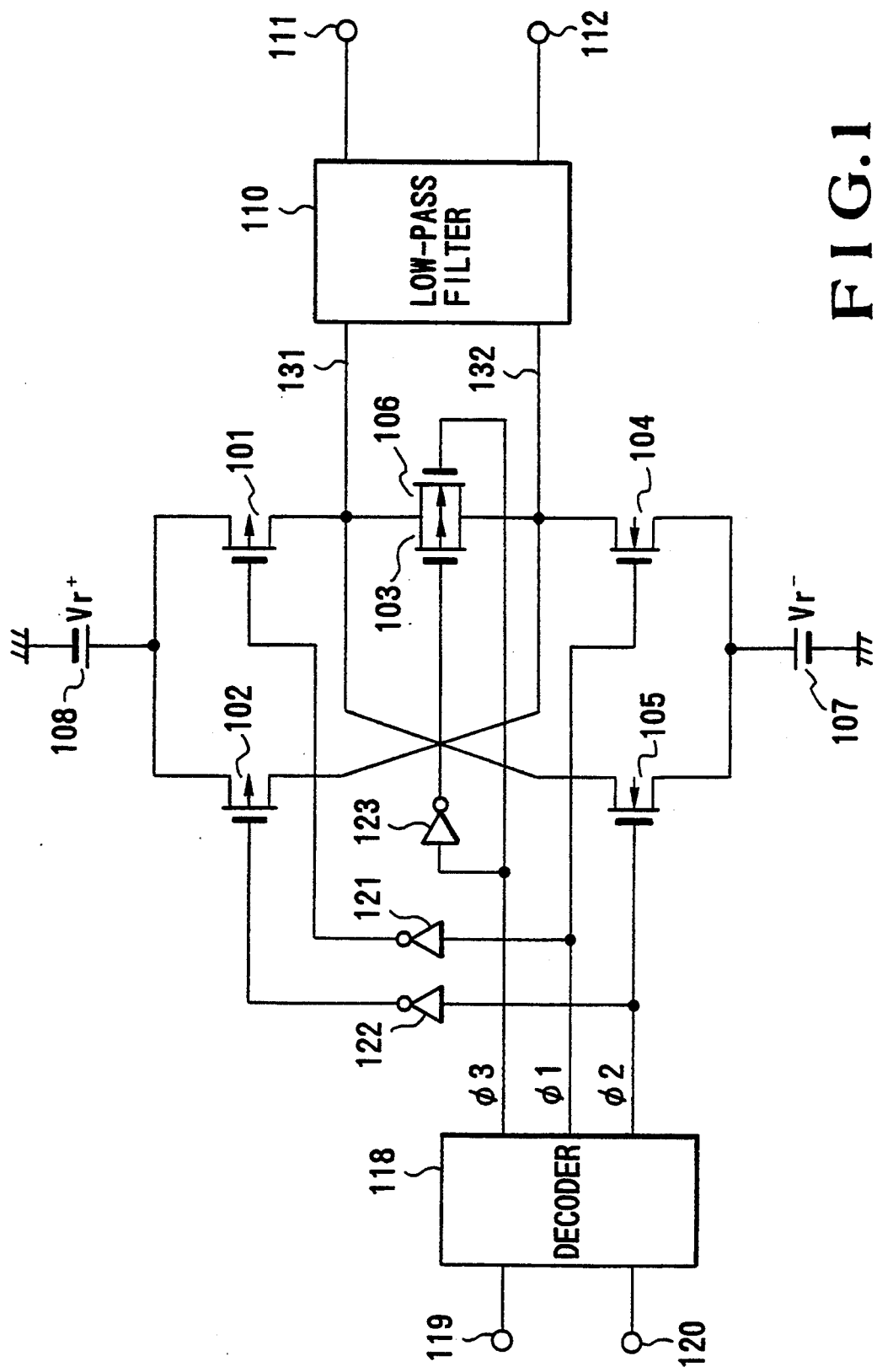
FIG. 1 is a circuit diagram showing a local D/A converter according to an embodiment of the present invention.

FIG. 1 shows a local D/A converter according to an embodiment of the present invention. Assume that this local D/A converter is connected to the output stage of the ΔΣ modulator 71 shown in FIG. 6. Referring to FIG. 1, the first and second inputs of a decoder 118 are respectively connected to input terminals 119 and 120. A first output Φ1 of the decoder 118 is connected to the input of an inverter circuit 121 and the gate of an n-channel MOS transistor (to be referred to as an NMOS hereinafter) 104. A second output Φ2 of the decoder 118 is connected to the input of an inverter circuit 122 and the gate of an NMOS 105. A third output Φ3 from the decoder 118 is connected to the input of an inverter circuit 123 and the gate of an NMOS 106.

The output of the inverter circuit 121 is connected to the gate of a p-channel MOS transistor (to be referred to as a PMOS hereinafter) 101. The output of the inverter circuit 122 is connected to the gate of a PMOS 102. The output of the inverter circuit 123 is connected to the gate of a PMOS 103.

A first input 131 of a full differential type low-pass filter 110 is connected to the drains of the PMOSs 101 and 103 and of the NMOSs 105 and 106. A second input 132 of the full differential type low-pass filter 110 is connected to the drain of the PMOS 102, the source of the PMOS 103, the drain of the NMOS 104, and the source of the NMOS 106.

The sources of the PMOSs 101 and 102 are connected to a reference voltage source 108 set at a voltage Vr+. The sources of the NMOSs 104 and 105 are connected to a reference voltage source 107 set at a voltage Vr−.

The first and second outputs of the full differential type low-pass filter 110 are respectively connected to analog signal output terminals 111 and 112.

Figure 2:
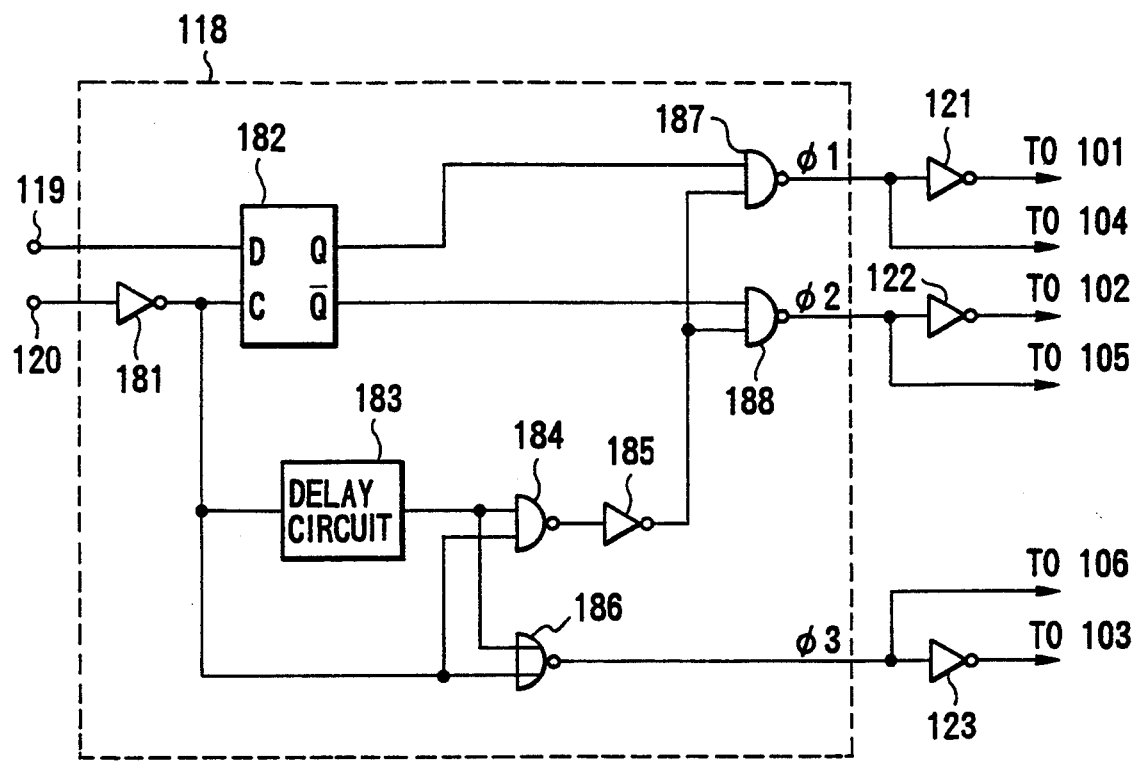
FIG. 2 is a circuit diagram showing an arrangement of a decoder 118 in FIG. 1.
Figure 3:
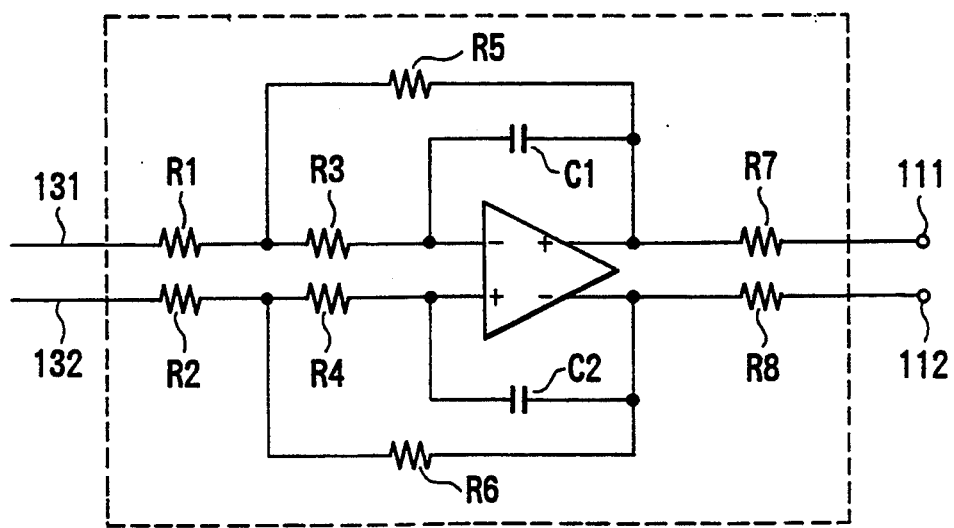
FIG. 3 is a circuit diagram showing an arrangement of a low-pass filter 110 in FIG. 1.

FIG. 2 shows an arrangement of the decoder 118 in FIG. 1. Referring to FIG. 2, reference numerals 181 and 185 denote inverter circuits, respectively; 182, a D flip-flop; 183, a delay circuit; 184, 187, and 188, NAND gates, respectively; and 186, a NOR gate. FIG. 3 shows an arrangement of the full differential type low-pass filter 110. Referring to FIG. 3, reference symbols R1 to R8, resistors; C1 and C2, capacitors; and AMP, an operational amplifier.

Figure 4:
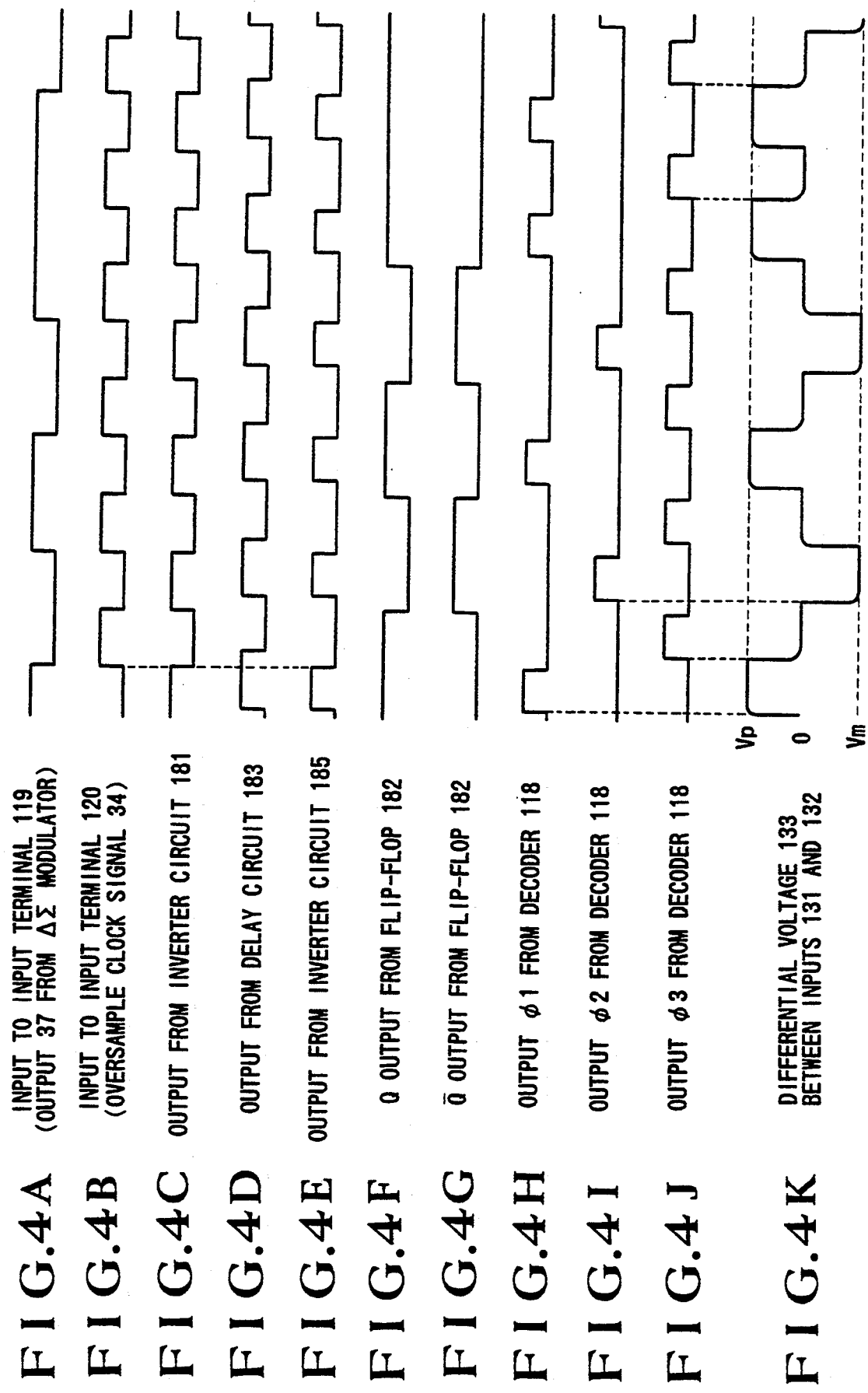
FIGS. 4A to 4K are timing charts showing the waveforms of signals at the respective portions of the circuits in FIGS. 1 and 2.
Figure 5:
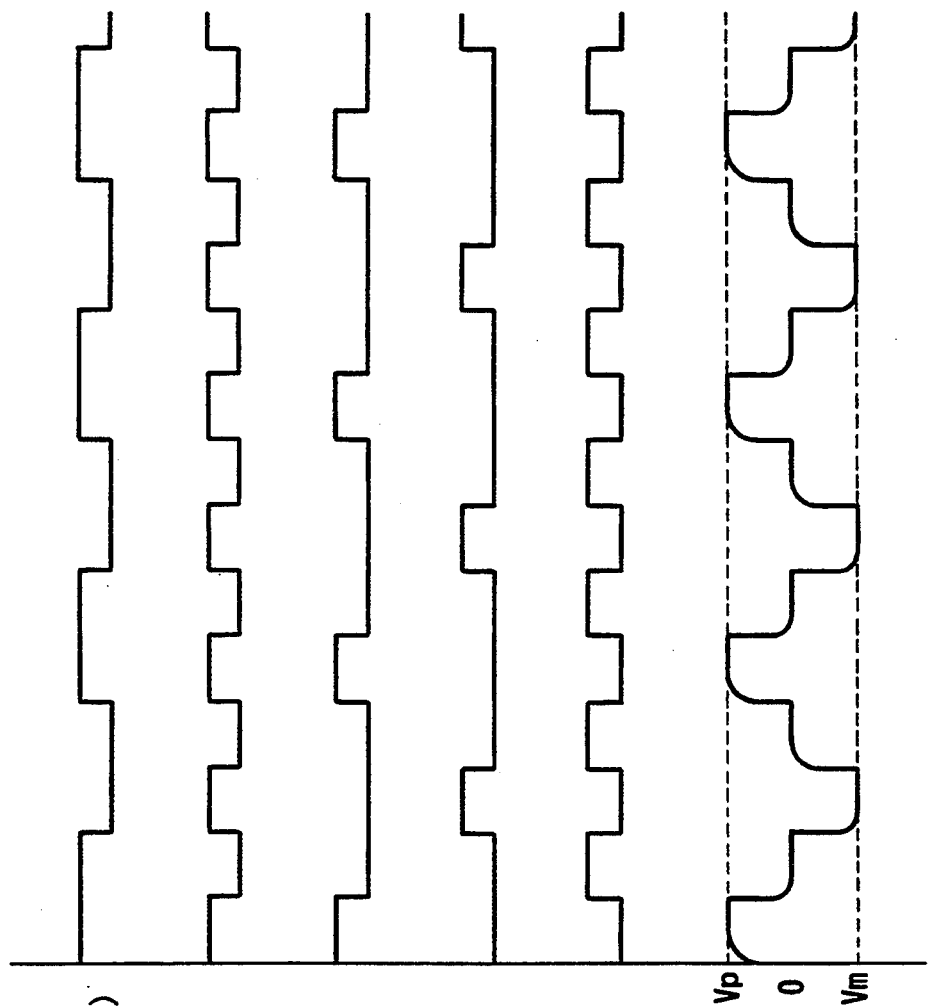
FIGS. 5A to 5F are timing charts other than the timing charts shown in FIGS. 4A to 4K.
Figure 6:
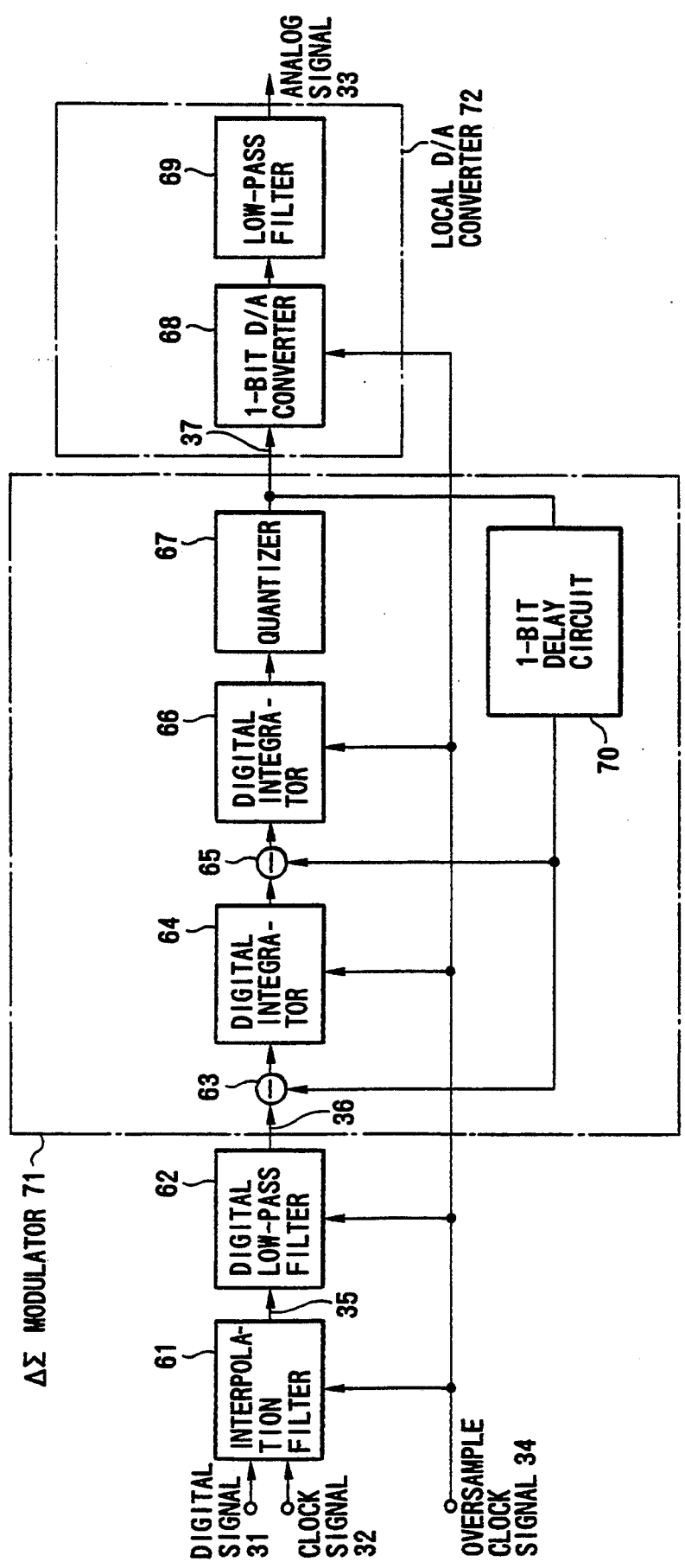
FIG. 6 is a block diagram showing an oversampling type D/A converter.
Figure 7:
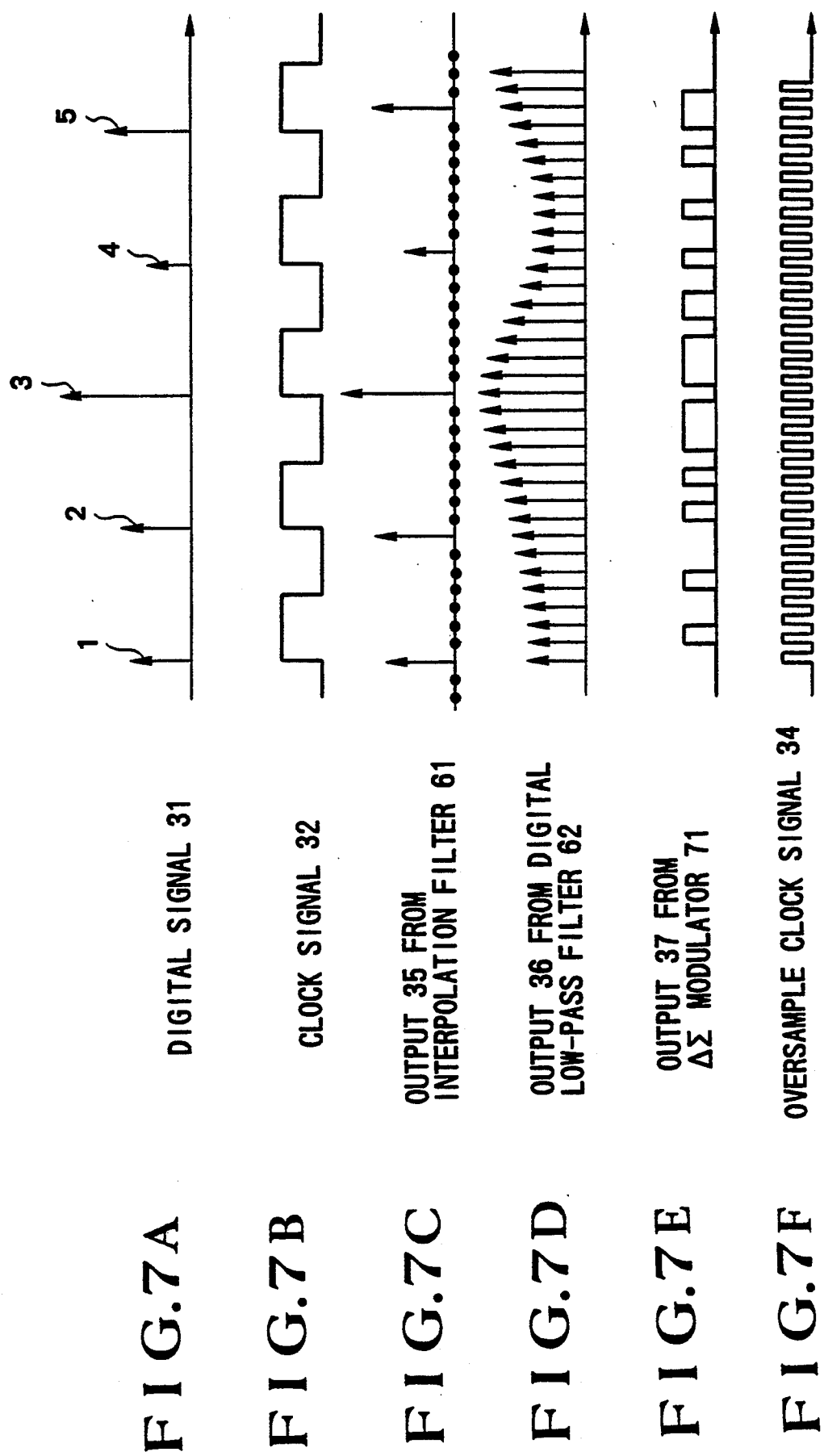
FIGS. 7A to 7F are timing charts showing the waveforms of signals at the respective portions of the circuit in FIG. 6.
Figure 8:
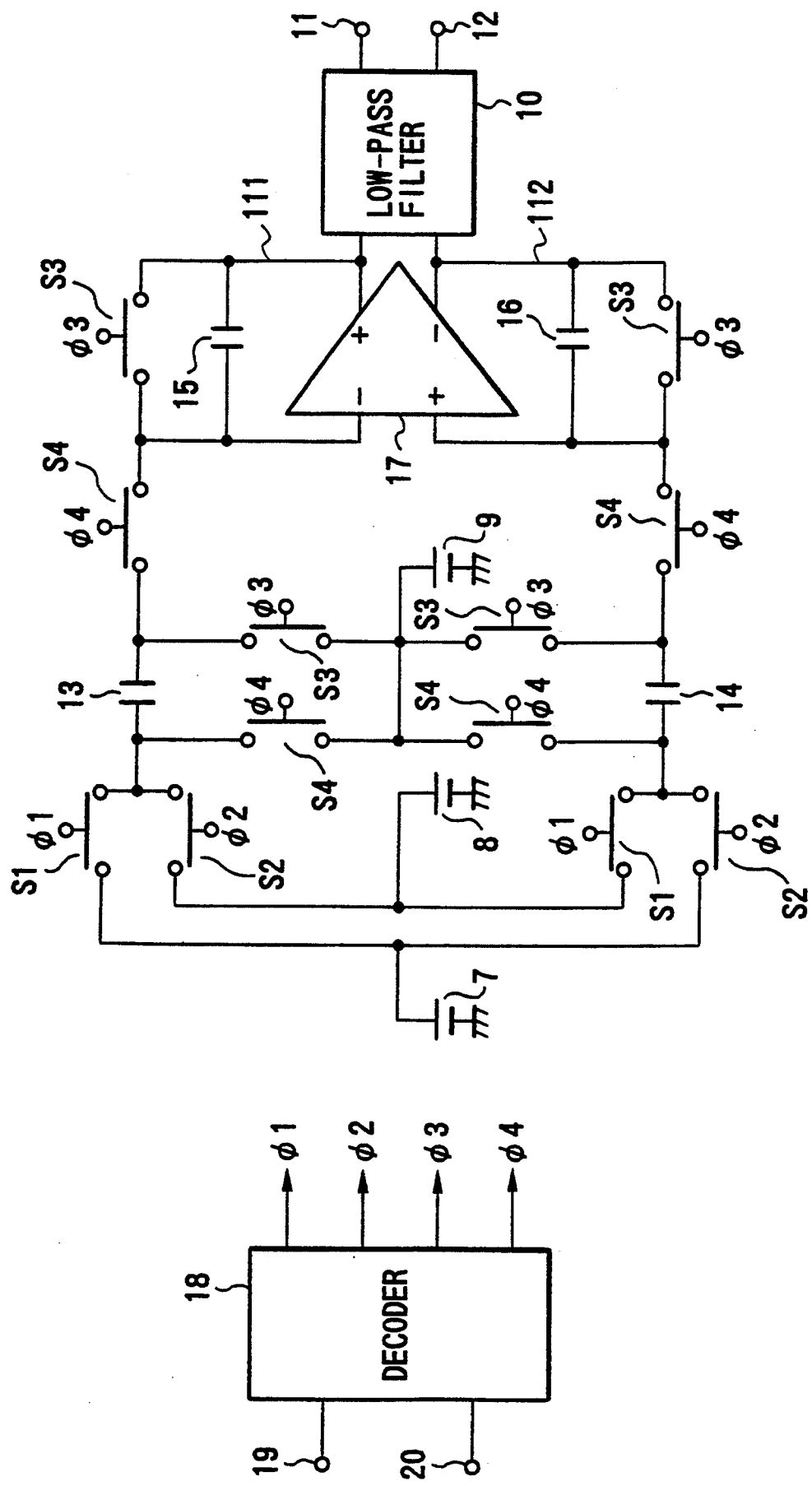
FIG. 8 is a circuit diagram showing a conventional local D/A converter.

FIGS. 4A to 4K show operations of the respective portions of the circuits in FIGS. 1 and 2. When the pulse-density-modulated output 37 from the ΔΣ modulator 71 shown in FIG. 6 is input to the input terminal 119 of the decoder 118, as shown in FIG. 4A, and the oversample clock signal 34 is input to the input terminal 120 of the decoder 118, as shown in FIG. 4B, the outputs Φ1, Φ2, and Φ3 are decoded at the timings shown in FIGS. 4H to 4J, respectively, thus ON/OFF-controlling the PMOSs 101, 102, and 103, and the NMOSs 104, 105, and 106. More specifically, as shown in FIG. 2, in the decoder 118, the oversample clock signal 34 is supplied to the clock input of the D flip-flop 182 through the inverter circuit 181. The output 37 from the ΔΣ modulator 71 is supplied to the data input of the D flip-flop 182. The output from the inverter circuit 181 is supplied to the delay circuit 183 and the NOR gate 186. The NAND gate 184 receives outputs from the delay circuit 183 and the inverter circuit 181. The resultant output is then supplied to the NAND gates 187 and 188 through the inverter circuit 185. The NAND gate 184 and the inverter circuit 185 generate a clock pulse which falls at the leading edge of the oversample clock signal 34. The NOR gate 186 generates a clock pulse which falls at the trailing edge of the oversample clock signal 34. The NOR gate 186 outputs the output Φ3. Outputs Q and $\overline{Q}$ from the D flip-flop 182 are respectively supplied to the NAND gates 187 and 188 to generate the outputs Φ1 and Φ2. That is, the outputs Φ1 and Φ2 fall at the leading edge of the oversample clock signal 34 to generate a pulse in accordance with logic "1" of the outputs Q and $\overline{Q}$, and that the output Φ3 falls at the trailing edge of the oversample clock signal 34.

Note that the timings of the outputs Φ1 to Φ3 with respect to the oversample clock signal 34 need not be set in the manner shown in FIGS. 4A to 4K but may be set in the manner shown in FIGS. 5A to 5F.

When the PMOS 101 and the NMOS 104 are turned on in response to the output Φ1, the first and second inputs of the full differential type low-pass filter 110 are respectively connected to the voltages Vr+ and Vr− of the reference voltages source 108 and 109. When the PMOS 102 and the NMOS 105 are turned on in response to the output Φ2, the first and second inputs of the full differential type low-pass filter 110 are respectively connected to the voltages Vr− and Vr+ of the reference voltage sources 107 and 108. When the PMOS 103 and the NMOS 106 are turned on in response to the output Φ3, the first and second inputs of the full differential type low-pass filter 110 are connected to each other, and a voltage Vag which has a magnitude between the voltages Vr+ and Vr− is set between the first and second inputs. With this operation, a differential voltage 133 is generated between the first and second inputs 131 and 132 of the full differential type low-pass filter 110. If, for example, the differential voltage 133 (Vr+ −Vr−) is represented by Vp; and a differential voltage (Vr− −Vr+), by Vm, the differential voltage Vp is obtained when the output 37, as a digital signal, from the ΔΣ modulator 71 is at logic "1", whereas the differential voltage Vm is obtained when the output 37 is at logic "0". That is, digital signals of logic "1" and logic "0" are converted into analog signals Vp and Vm. These analog signals are then filtered by the full differential type low-pass filter 110. The resultant signals are obtained, as full differential analog signals of higher precision, from the analog signal output terminals 111 and 112, as in the conventional device.

That is, the local D/A converter of the embodiment is not designed to perform D/A conversion by using a full differential type operational amplifier, as in the conventional local D/A converter, but is designed to perform D/A conversion by only ON/OFF-controlling the MOS transistors in such a manner that the reference voltage sources are connected to the inputs of the full differential type low-pass filter or the inputs are connected to each other. Therefore, the speed of D/A conversion is limited by only the ON resistance of each MOS transistor and the time constant based on a parasitic capacitance coupled to each input of the full differential type low-pass filter. If the ON resistance of each MOS transistor and the parasitic capacitance coupled to each input of the full differential type low-pass filter are respectively represented by $R_{on}$ and $C_s$, and the settling error is 1% or less, an operating frequency $f_{max}$ of the D/A converter can be given by equation (2):

$$f_{max}=1/(5 \cdot R_{on} \cdot C_s) \quad (2)$$

As is apparent from equation (2), if $C_s=1$ pF, an operation at 100 MHz or more can be performed by setting the ON resistance $R_{on}$ to be 2 kΩ or less. The PN resistance can be easily set to be 2 kΩ or less by properly determining the transistor size of each MOS transistor.

As has been described above, since the present invention realizes a 7 bit D/A converter constituting a local D/A converter without using a full differential type operational amplifier, the speed of D/A conversion of the 7 bit converter is not limited by the infinite GB product of a full differential type operational amplifier and thereby can be easily increased. Further a reduction in power consumption and circuit size of the local D/A converter can be achieved.

What is claimed is:

1. A digital-to-analog converter comprising:
    a decoder having first and second inputs and firsts second and third outputs;
    a full differential type low-pass filter having first and second inputs and first and second outputs;
    a first switch having a first terminal connected to a first reference voltage source, a second terminal connected to the first input of said full differential type low-pass filter, and a third terminal as a control terminal connected to the first output of said decoder;
    a second switch having a first terminal connected to said first reference voltage source, a second terminal connected to the second input of said full differential type low-pass filter, and a third terminal as a control terminal connected to the second output of said decoder;
    a third switch having a first terminal connected to a second reference voltage source, a second terminal connected to the second input of said full differential type low-pass filter, and a third terminal as a control terminal connected to the first output of said decoder;
    a fourth switch having a first terminal connected to said second reference voltage source, a second terminal connected to the first input of said full differential type low-pass filter, and a third terminal connected to the second output of said decoder;
    a fifth switch having a first terminal connected to the first input of said full differential type low-pass filter, a second terminal connected to the second input of said full differential type low-pass filter, and a third terminal as a control terminal connected to the third output of said decoder; and a sixth switch having a first terminal connected to the second input of said full differential type low-pass filter, a second terminal connected to the first input of said full differential type low-pass filter, and a third terminal as a control terminal connected to the third output of said decoder.

2. A converter according to claim 1, wherein said first, second, and fifth switches are p-channel MOS transistors, and
said third, fourth and sixth switches are n-channel MOS transistors.

3. A digital-to-analog converter comprising:
a decoder having first and second inputs and first and second outputs;
a full differential type low-pass filter having first and second inputs and first and second outputs;
a first inverter circuit for receiving the first output of said decoder as an input;
a second inverter circuit for receiving the second output of said decoder as an input;
a first p-channel MOS transistor having a drain connected to the first input of said full differential type low-pass filter, a source connected to a first reference voltage source, and a gate connected to an output of said first inverter circuit;
a second p-channel MOS transistor having a drain connected to the second input of said full differential type low-pass filter, and a source connected to said first reference voltage source, and a gate connected to an output of said second inverter circuit;
a first n-channel MOS transistor having a drain connected to the second input of said full differential type low-pass filter, a source connected to a second reference voltage source, and a gate connected to the first output of said decoder; and
a second n-channel MOS transistor having a drain connected to the first input of said full differential type low-pass filter, a source connected to said second reference voltage source, and a gate connected to the second output of said decoder.

4. A converter according to claim 3, wherein said decoder has a third output, and
said converter comprises:
a third inverter circuit for receiving the third output of said decoder as an input;
a first switch having a first terminal connected to the first input of said full differential type low-pass filter, a second terminal connected to the second input of said full differential type low-pass filter, and a third terminal connected to the output of said third inverter circuit; and
a second switch having a first terminal connected to the second input of said full differential type low-pass filter, a second terminal connected to the first input of said full differential type low-pass filter, and a third terminal connected to the third output of said decoder.

* * * * *